United States Patent
Sonoda

(10) Patent No.: US 9,191,596 B2
(45) Date of Patent: Nov. 17, 2015

(54) SOLID-STATE IMAGING DEVICE, CONTROL METHOD AND ELECTRONIC APPARATUS TO OBTAIN FRAME DIFFERENCE OUTPUT VALUES

(71) Applicant: Sony Corporation, Tokyo (JP)

(72) Inventor: Shuuji Sonoda, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 105 days.

(21) Appl. No.: 14/019,279

(22) Filed: Sep. 5, 2013

(65) Prior Publication Data
US 2014/0078367 A1   Mar. 20, 2014

(30) Foreign Application Priority Data
Sep. 18, 2012   (JP) .................................. 2012-204107

(51) Int. Cl.
| H04N 3/14 | (2006.01) |
| H04N 5/372 | (2011.01) |
| H04N 5/3745 | (2011.01) |
| H04N 5/374 | (2011.01) |
| H01L 27/146 | (2006.01) |
| H04N 5/378 | (2011.01) |

(52) U.S. Cl.
CPC .......... *H04N 5/372* (2013.01); *H01L 27/14634* (2013.01); *H04N 5/378* (2013.01); *H04N 5/3741* (2013.01); *H04N 5/3745* (2013.01); *H04N 5/37455* (2013.01)

(58) Field of Classification Search
USPC ........ 348/241, 294, 302, 308–310; 250/208.1
See application file for complete search history.

(56) References Cited

U.S. PATENT DOCUMENTS

| 7,230,558 | B2 * | 6/2007 | Lim .............................. 341/155 |
| 7,786,921 | B2 * | 8/2010 | Nitta et al. .................... 341/164 |
| 7,800,526 | B2 * | 9/2010 | Nitta et al. .................... 341/164 |
| 7,859,583 | B2 * | 12/2010 | Kawaguchi ................... 348/308 |
| 8,243,179 | B2 * | 8/2012 | Shoho et al. .................. 348/312 |
| 2012/0104233 | A1 * | 5/2012 | Mori et al. ................. 250/208.1 |
| 2012/0229666 | A1 * | 9/2012 | Hagihara ................... 348/222.1 |
| 2014/0034812 | A1 * | 2/2014 | Ikuma et al. ............... 250/208.1 |

FOREIGN PATENT DOCUMENTS

JP   2006-033452 A   2/2006

* cited by examiner

Primary Examiner — Ngoc-Yen Vu
(74) Attorney, Agent, or Firm — Hazuki International, LLC

(57) ABSTRACT

A solid-state imaging device includes: a pixel array unit with pixels, each of the pixels including a photoelectric conversion element that generates a charge and a memory that holds the charge; and an AD conversion unit that converts a pixel signal corresponding to the charge output from the pixel into a count value. The pixel transfers the charge held in the memory in the $n^{th}$ frame and sequentially outputs, in the $n^{th}+1$ frame, a first pixel signal corresponding to the charge held in the memory and a second pixel signal corresponding to a charge generated by the photoelectric conversion element after the previous charge has been transferred to the memory. In the $n^{th}+1$ frame, the AD conversion unit changes its up/down count direction between the first and second pixel signals to obtain their count values so as to successively perform AD conversion on the first and second pixel signals.

6 Claims, 18 Drawing Sheets

SOLID-STATE IMAGING DEVICE, CONTROL METHOD AND ELECTRONIC APPARATUS TO OBTAIN FRAME DIFFERENCE OUTPUT VALUES

BACKGROUND

The present technology relates to solid-state imaging devices, control methods and electronic apparatuses, and more particularly, relates to a solid-state imaging device capable of outputting frame differences, a method for controlling the solid-state imaging device and an electronic apparatus including the solid-state imaging device.

For detecting changes in images in a surveillance apparatus or the like, a common method utilizes frame differences which are differences between a current image captured at present and an image captured before the current image. The frame difference processing is generally performed by an image processing circuit provided on the downstream side of an image sensor.

An increase in the number of pixels for resolution enhancement of an image sensor increases the data size of a single image and resultantly increases the load on image processing. If the image sensor itself can perform the frame difference processing instead of the image processing circuit provided on the downstream side of the image sensor, the load imposed on the image processing circuit can be reduced.

One of the image sensors enabling difference output that have been proposed until now is configured to output a difference between a pixel signal from a pixel on the $y^{th}$ line and a pixel signal from a pixel on the $y^{th}+1$ line among two-dimensionally arranged pixels (See, for example, Japanese Unexamined Patent Application Publication No. 2006-33452).

However, no image sensors have yet been developed that can output frame differences.

The present technology has been made in view of such circumstances and enables frame difference output.

SUMMARY

A solid-state imaging device according to the first embodiment of the present technology includes a pixel array unit with a plurality of pixels arranged therein, each of the pixels including at least a photoelectric conversion element that generates a charge corresponding to light received and a memory that holds the charge generated by the photoelectric conversion element, and an AD conversion unit that performs AD conversion to convert a pixel signal that corresponds to the charge output from the pixel into a count value, wherein the pixel transfers the charge generated by the photoelectric conversion element to the memory so as to hold the charge in the memory in the $n^{th}$ frame, and sequentially outputs, in the $n^{th}+1$ frame, a first pixel signal corresponding to the charge held in the memory and a second pixel signal corresponding to a charge generated by the photoelectric conversion element after the previous charge has been transferred to the memory, and the AD conversion unit, in the $n^{th}+1$ frame, changes its up/down count direction between the first pixel signal and the second pixel signal to obtain their count values so as to successively perform AD conversion on the first pixel signal and the second pixel signal.

The second embodiment of the present technology is directed to a method for controlling a solid-state imaging device including a pixel array unit with a plurality of pixels arranged therein, each of the pixels including at least a photoelectric conversion element that generates a charge corresponding to light received and a memory that holds the charge generated by the photoelectric conversion element, and an AD conversion unit that performs AD conversion to convert a pixel signal that corresponds to the charge output from the pixel into a count value, the method including: causing the pixel to transfer the charge generated by the photoelectric conversion element to the memory so as to hold the charge in the memory in the $n^{th}$ frame, and sequentially outputting, in the $n^{th}+1$ frame, a first pixel signal corresponding to the charge held in the memory and a second pixel signal corresponding to a charge generated by the photoelectric conversion element after the previous charge has been transferred to the memory; and causing the AD conversion unit, in the $n^{th}+1$ frame, to change its up/down count direction between the first pixel signal and the second pixel signal to obtain their count values so as to successively perform AD conversion on the first pixel signal and the second pixel signal.

The third embodiment of the present technology is directed to an electronic apparatus including a solid-state imaging device having a pixel array unit with a plurality of pixels arranged therein, each of the pixels including at least a photoelectric conversion element that generates a charge corresponding to light received and a memory that holds the charge generated by the photoelectric conversion element, and an AD conversion unit that performs AD conversion to convert a pixel signal that corresponds to the charge output from the pixel into a count value, wherein the pixel transfers the charge generated by the photoelectric conversion element to the memory so as to hold the charge in the memory in the $n^{th}$ frame, and sequentially outputs, in the $n^{th}+1$ frame, a first pixel signal corresponding to the charge held in the memory and a second pixel signal corresponding to a charge generated by the photoelectric conversion element after the previous charge has been transferred to the memory, and the AD conversion unit, in the $n^{th}+1$ frame, changes its up/down count direction between the first pixel signal and the second pixel signal to obtain their count values so as to successively perform AD conversion on the first pixel signal and the second pixel signal.

The first to third embodiments of the present technology include a pixel array unit with a plurality of pixels arranged therein, each of the pixels including at least a photoelectric conversion element that generates a charge corresponding to light received and a memory that holds the charge generated by the photoelectric conversion element, and an AD conversion unit that performs AD conversion to convert a pixel signal that corresponds to the charge output from the pixel into a count value, wherein the pixel transfers the charge generated by the photoelectric conversion element to the memory so as to hold the charge in the memory in the $n^{th}$ frame, and sequentially outputs, in the $n^{th}+1$ frame, a first pixel signal corresponding to the charge held in the memory and a second pixel signal corresponding to a charge generated by the photoelectric conversion element after the previous charge has been transferred to the memory, and the AD conversion unit, in the $n^{th}+1$ frame, changes its up/down count direction between the first pixel signal and the second pixel signal to obtain their count values so as to successively perform AD conversion on the first pixel signal and the second pixel signal.

According to the first to third embodiments of the present technology, the frame differences can be output.

DETAILED DESCRIPTION OF EMBODIMENTS

[Configuration Example of CMOS Image Sensor]

Figure 1:
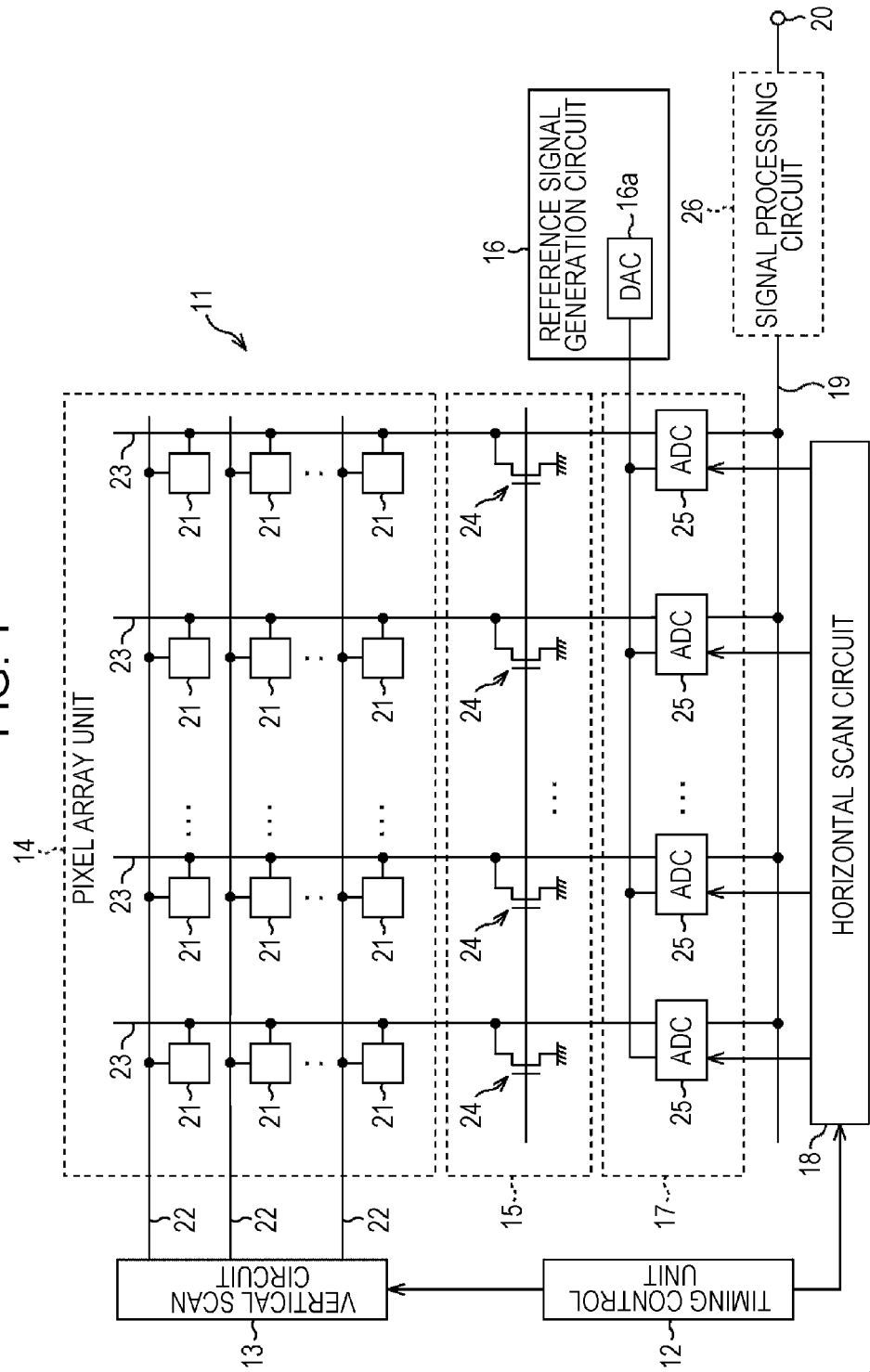
FIG. 1 is a block diagram showing a configuration example of a CMOS image sensor according to an embodiment, the present technology being applied to the CMOS image sensor.

FIG. 1 illustrates a configuration example of a CMOS image sensor (solid-state imaging device) according to an embodiment, the present technology being applied to the CMOS image sensor.

The CMOS image sensor 11 shown in FIG. 1 includes a timing control unit 12, a vertical scan circuit 13, a pixel array unit 14, a constant current source circuit 15, a reference signal generation circuit 16, a column AD converter 17, a horizontal scan circuit 18, a horizontal output line 19 and an output unit 20.

The timing control unit 12 supplies clock signals and timing signals necessary for predetermined operations to the vertical scan circuit 13 and horizontal scan circuit 18 based on master clocks with a predetermined frequency. For instance, the timing control unit 12 supplies timing signals used to actuate shutter operations and readout operations of pixels 21 to the vertical scan circuit 13 and horizontal scan circuit 18. In addition, although it is not illustrated, the timing control unit 12 also supplies clock signals and timing signals necessary for predetermined operations to the reference signal generation circuit 16 and column AD converter 17.

The vertical scan circuit 13 sequentially supplies signals that control output of pixel signals to the pixels 21 arranged in the vertical direction of the pixel array unit 14 at predetermined timings.

The pixel array unit 14 includes a plurality of pixels 21 arranged in a two-dimensional array (in a matrix).

The pixels 21 arranged in a two-dimensional array are connected to the vertical scan circuit 13 with horizontal signal lines 22 on a row-by-row basis. In other words, a plurality of pixels 21 arranged along a row in the pixel array unit 14 are connected to the vertical scan circuit 13 with a single horizontal signal line 22.

In addition, the pixels 21 arranged in a two-dimensional array are connected to the horizontal scan circuit 18 with vertical signal lines 23 on a column-by-column basis. In other words, a plurality of pixels 21 arranged along a column in the pixel array unit 14 are connected to the horizontal scan circuit 18 with a single vertical signal line 23.

Each of the pixels 21 in the pixel array unit 14 outputs a pixel signal corresponding to an internally stored charge to the vertical signal line 23 in response to a signal supplied from the vertical scan circuit 13 through the horizontal signal line 22. Details regarding the configuration of the pixels 21 will be described later with reference to FIG. 2.

The constant current source circuit 15 includes a plurality of load MOSs 24, each of which is connected to one of the vertical signal lines 23. Each of the load MOSs 24 has a gate to which bias voltage is applied and a source, which is grounded, and makes up a source follower circuit together with transistors in the pixels 21 connected with the vertical signal line 23.

The reference signal generation circuit 16 includes a DAC (Digital to Analog Converter) 16a, generates reference signals with a ramp waveform in response to clock signals from the timing control unit 12, and supplies the generated reference signals to the column AD converter 17.

The column AD converter 17 includes a plurality of ADCs (Analog to Digital Converters) 25, each of which is connected to one of the columns of the pixel array unit 14. In short, a plurality of pixels 21, one load MOS 24 and one ADC 25 are connected to one vertical signal line 23.

The ADC 25 performs CDS (Correlated Double Sampling) processing on pixel signals fed via the vertical signal line 23 from the pixels 21 on the same column as the ADC 25 and further performs A/D conversion processing on the pixel signals.

Each of the ADCs 25 temporarily stores the A/D-converted pixel data therein and outputs the pixel data to the horizontal output line 19 under control of the horizontal scan circuit 18.

The horizontal scan circuit 18 causes the ADCs to output the pixel data, which is stored in the ADCs 25, in sequence at predetermined timings to the horizontal output line 19.

The horizontal output line 19 is connected with the output unit 20 that in turn outputs the pixel data supplied from the ADCs 25 to the outside of the CMOS image sensor 11.

On the upstream side of the output unit 20, there can be provided a signal processing circuit 26 that performs predetermined signal processing, such as correction processing, on the pixel data input via the horizontal output line 19 and outputs the pixel data having been subjected to the processing from the output unit 20.

The CMOS image sensor 11 configured as described above employs a so-called column-parallel AD conversion technique in which each vertical column has its own ADC 25 which performs CDS processing and AD conversion processing.

[Detailed Configuration Example of Pixel 21 and ADC 25]

Figure 2:
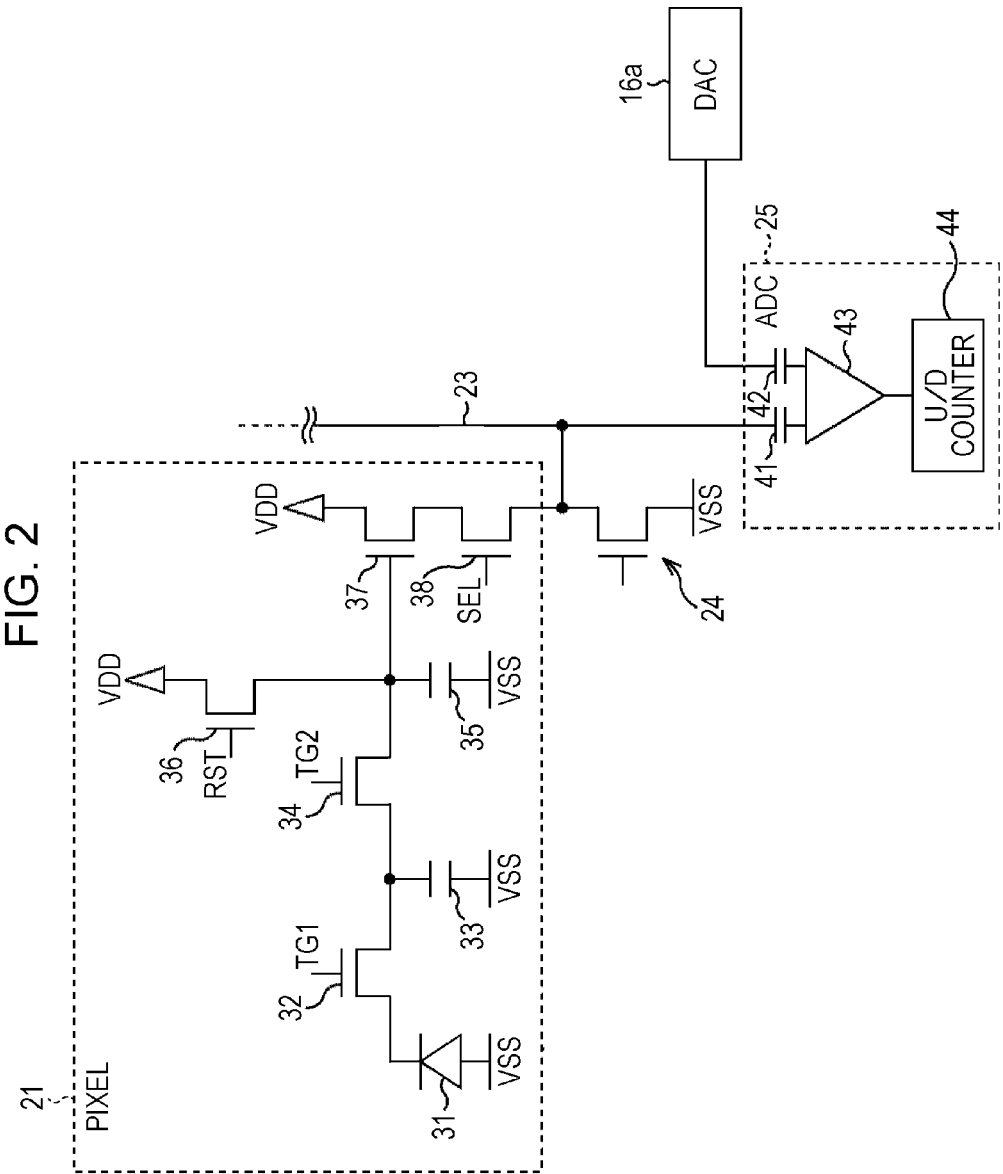
FIG. 2 illustrates a configuration of a pixel and an ADC in detail.

With reference to FIG. 2, the configuration of the pixel 21 and ADC 25 will be described in detail.

FIG. 2 shows a pixel 21 in the pixel array unit 14, a load MOS 24 in the constant current source circuit 15, and an ADC 25 in the column AD converter 17, which are connected to a single vertical signal line 23.

The pixel 21 includes a photodiode 31 functioning as a photoelectric conversion element, a first readout transistor 32, a pixel memory 33, a second readout transistor 34, an FD (floating diffuser) 35, a reset transistor 36, an amplifying transistor 37 and a selection transistor 38.

The photodiode 31 generates an electric charge (signal charge) corresponding to an amount of light received and accumulates the charges. The first readout transistor 32 is turned on by a transfer signal TG1 to read out the charge generated by the photodiode 31 and transfer the charge to the pixel memory 33. The pixel memory 33 holds the charge read out from the photodiode 31.

The second readout transistor 34 is turned on by a transfer signal TG2 to read out the charge held by the pixel memory 33 and transfer the charge to the FD 35. Concurrently turning on the first readout transistor 32 and second readout transistor 34 allows direct transfer of the charge generated by the photodiode 31 to the FD 35.

The FD 35 holds the charge read out from the photodiode 31 or pixel memory 33. The reset transistor 36 is turned on by a reset signal RST and resets the potential of the FD 35. The amplifying transistor 37 outputs a pixel signal corresponding to the potential of the FD 35. The selection transistor 38 is turned on when a pixel 21 is selected by a selection signal SEL and then outputs a pixel signal of the pixel 21 to the ADC 25 through the vertical signal line 23. The operations conducted by the respective transistors are controlled by signals fed from the vertical scan circuit 13 via the horizontal signal line 22 (FIG. 1).

The ADC 25 includes capacitors 41, 42, a comparator 43, and an up/down counter (U/D CNT) 44.

The pixel signal output from the pixel 21 is input to the capacitor 41 of the ADC 25 through the vertical signal line 23. On the other hand, the capacitor 42 receives a reference signal fed from the DAC 16a of the reference signal generation circuit 16. The reference signal has a so-called ramp waveform in which the level (voltage) changes into a ramp shape with the passage of time.

The capacitors 41, 42 remove DC components from the reference signal and pixel signal so that the comparator 43 can compare only AC components in the reference signal and pixel signal.

The comparator 43 outputs a difference signal obtained by comparing the pixel signal with the reference signal to the up/down counter 44. For instance, if the reference signal is greater than the pixel signal, a Hi (High) difference signal is supplied to the up/down counter 44, whereas if the reference signal is smaller than the pixel signal, a Lo (Low) difference signal is supplied to the up/down counter 44.

During a P-phase (Preset Phase) AD conversion period, the up/down counter (U/D counter) 44 counts down only while the Hi difference signal is being supplied. During a D-phase (Data Phase) AD conversion period, the up/down counter 44 counts up only while the Hi difference signal is being supplied. Then, the up/down counter 44 adds up the down-count value during the P-phase AD conversion period and the up-count value during the D-phase AD conversion period and outputs the result of addition as pixel data subjected to CDS processing and AD conversion processing. Note that the up/down counter 44 occasionally counts up during the P-phase AD conversion period and counts down during the D-phase AD conversion period, as will be described later.

[Description of Moving Image Mode]

Figure 3:
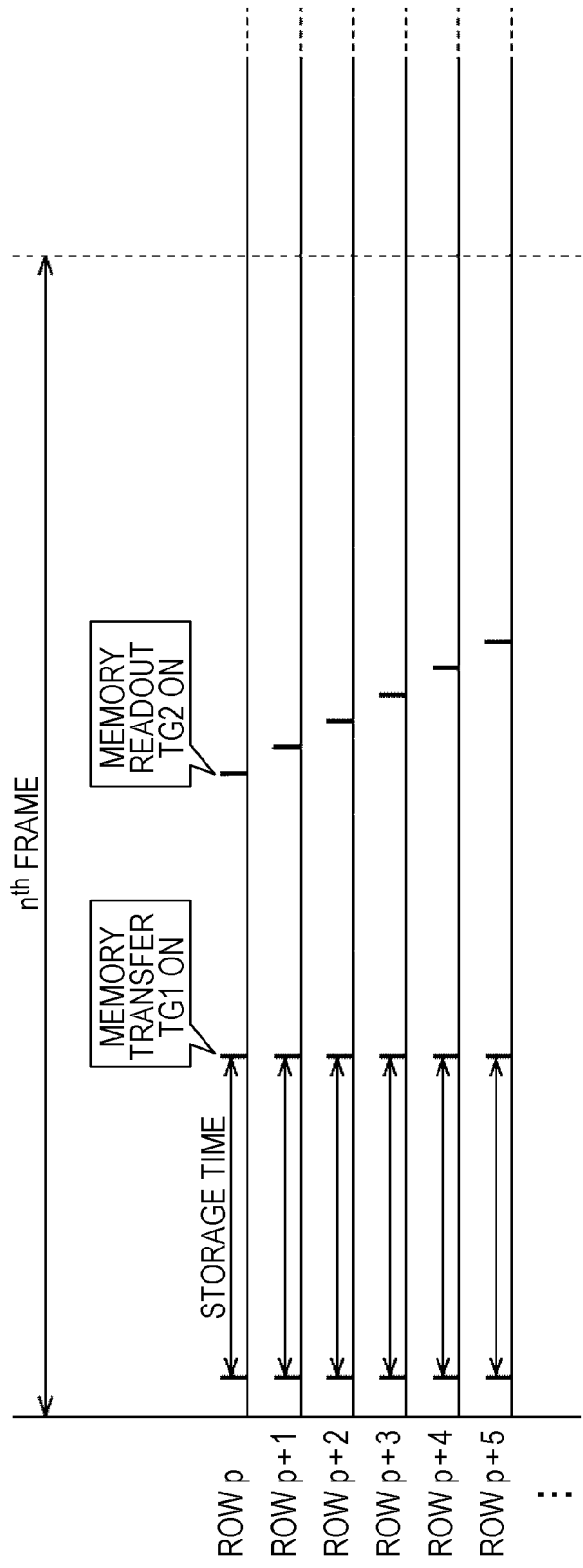
FIG. 3 is a timing diagram for describing drive operations of the CMOS image sensor in FIG. 1, in a moving image mode.

With reference to FIG. 3, a driving method executed when the CMOS image sensor 11 operates in a moving image mode will be described.

In a moving image mode, light reception (exposure) for the pixels 21 is controlled so that all the pixels 21 in the pixel array unit 14 are coincidentally exposed to light for an exposure period.

Specifically, as shown in FIG. 3, all the pixels 21 in the pixel array unit 14 simultaneously start receiving light (or start being exposed to light). After the elapse of a certain time, the first readout transistors 32 are turned on in response to transfer signals TG1, and charges generated by the photodiodes 31 are simultaneously transferred to the pixel memories 33.

Then, the vertical scan circuit 13 sequentially turns on the second readout transistors 34 of the pixels 21 in a predetermined order on a row-by-row basis by controlling transfer signals TG2. For instance, the vertical scan circuit 13 sequentially turns on the second readout transistors 34 starting from the one on row p in the pixel array unit 14. Upon turning on the second readout transistors 34, charges stored in the pixel memories 33 are read out and output to the ADCs 25 through the vertical signal lines 23.

The pixel signal that corresponds to the accumulated charge and that has been supplied to the ADC 25 is subjected to CDS processing and AD conversion processing as follows. During the P-phase AD conversion period, the up/down counter 44 counts down only while the Hi difference signal is being supplied. During a D-phase AD conversion period, the up/down counter 44 counts up only while the Hi difference signal is being supplied. The P-phase AD conversion period is a period for measuring a reset component $\Delta V$ which is a fluctuation component of the pixels, whereas the D-phase AD conversion period is a period for measuring (signal component Vsig+reset component $\Delta V$). A value obtained by adding up a count value during the P-phase AD conversion period and a count value during the D-phase AD conversion period is equal to a value obtained by AD converting a pixel signal corresponding to an accumulated charge. By combining a count value during the P-phase AD conversion period and a count value during the D-phase AD conversion period, the signal component Vsig can be obtained from (signal component Vsig+reset component $\Delta V$)−(reset component $\Delta V$), thereby simultaneous CDS processing and AD conversion processing is achieved.

The AD-converted pixel data is output from the up/down counter 44 of the ADC 25 to the output unit 20.

As described above, in the moving image mode, a subject image is captured and the pixel data of the respective pixels 21 is output according to a so-called global shutter system that enables synchronization of exposure periods of all pixels 21 by means of the pixel memories 33 that hold charges therein.

[Description of Frame Difference Output Mode]

A driving method in a frame difference output mode, which is uniquely provided to the CMOS image sensor 11, will be described.

Figure 4:
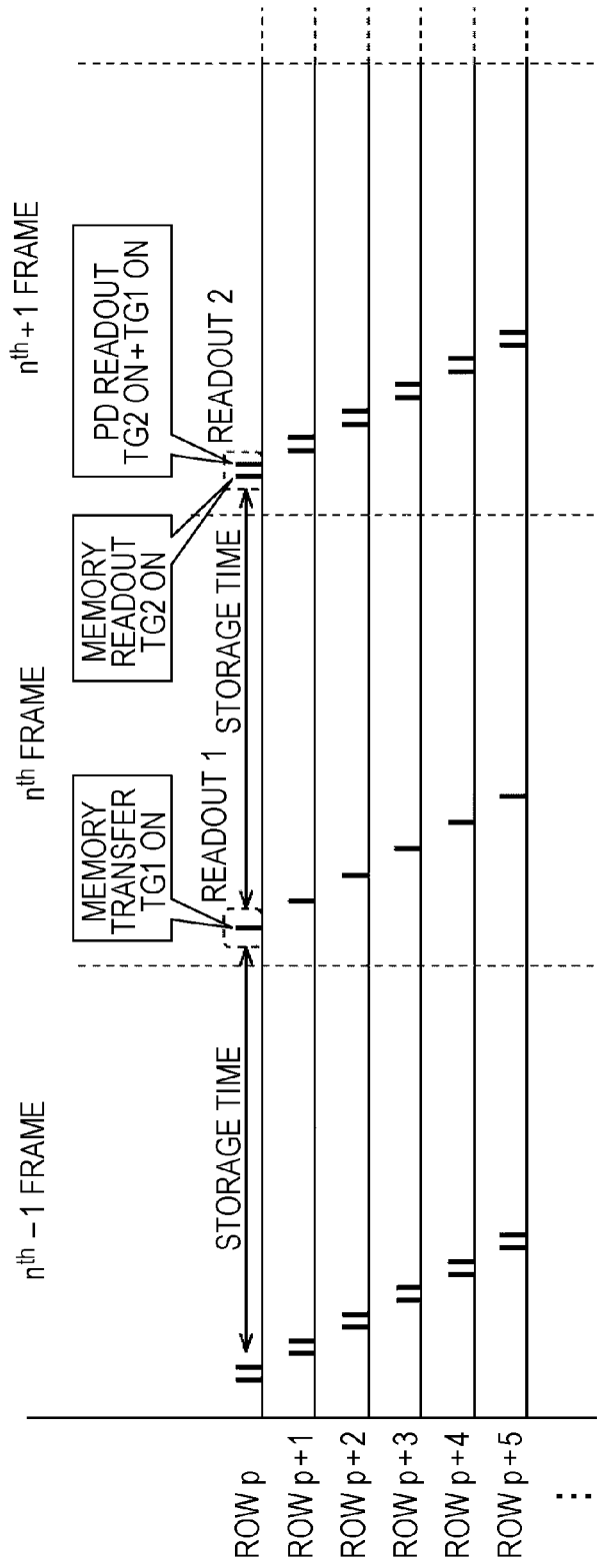
FIG. 4 is a timing diagram for describing drive operations of the CMOS image sensor in FIG. 1, in a frame difference output mode.

FIG. 4 is a timing diagram for describing drive operations in the frame difference output mode.

In the frame difference output mode, the CMOS image sensor 11 outputs the difference in pixel data between two consecutive frames at an interval of two frames.

Specifically, as shown in FIG. 4, the CMOS image sensor 11 performs an operation of transferring a charge, which was generated by a photodiode 31 in the $n^{th}-1$ frame, to a pixel memory 33 in the $n^{th}$ frame (n>1), and successively repeats the operation for every row in the pixel array unit 14. Then, in the $n^{th}+1$ frame, the CMOS image sensor 11 performs an operation of outputting the charge, which was transferred to the pixel memory 33 in the $n^{th}$ frame, to the ADC 25 and an operation of outputting a charge, which was generated by the photodiode 31 after the previous charge had been transferred to the pixel memory 33 in the $n^{th}$ frame, to the ADC 25, and successively performs the operations for every row in the pixel array unit 14.

The ADC 25 successively performs AD conversion processing on the charge read out from the pixel memory 33 and the charge read out from the photodiode 31 in the $n^{th}+1$ frame. In the $n^{th}$ frame, neither CDS processing nor AD conversion processing is performed because the charge generated in the pixel 21 has not yet been output to the ADC 25.

The storage time (exposure period) elapsed from the time at which a charge starts to be stored in the $n^{th}-1$ frame to the time at which the charge is transferred to the pixel memory 33 in the $n^{th}$ frame is equal to the storage time (exposure period) elapsed from the time at which the charge has been transferred to the pixel memory 33 to the time at which a charge stored in the photodiode 31 is transferred in the $n^{th}+1$ frame. The storage time spent for each row is the same in every frame.

[Readout Operation from Photodiode in $n^{th}$ Frame]

Figure 5:
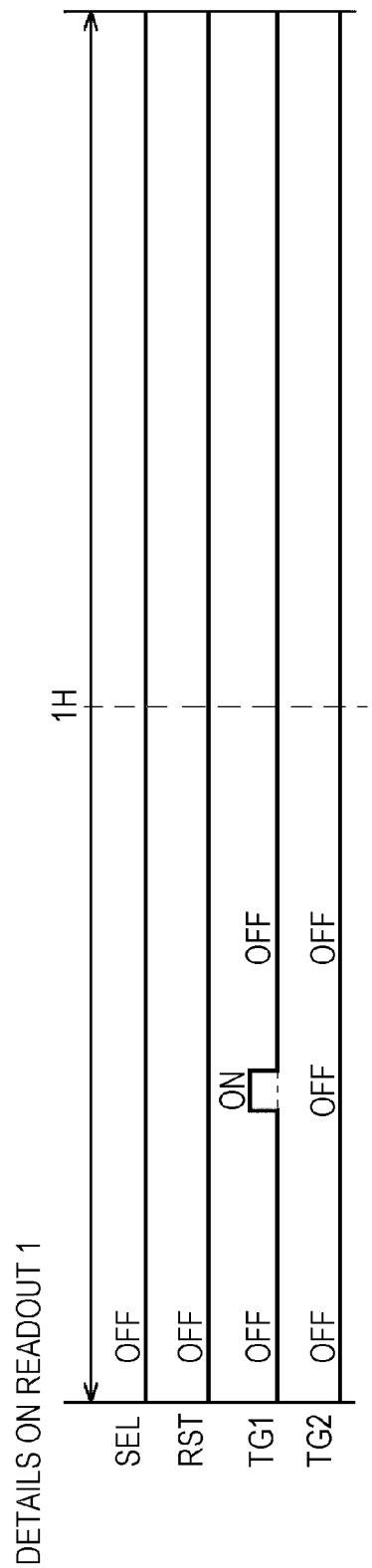
FIG. 5 is a timing diagram for describing in detail an operation to read out a charge from a photodiode in the $n^{th}$ frame.

FIG. 5 is a timing diagram for describing in detail an operation of transferring a charge stored in the photodiode 31 to the pixel memory 33 in a pixel 21 on row p (p≥1) in the $n^{th}$ frame.

When the time to read out a charge from a pixel 21 on row p occurs in the $n^{th}$ frame, the vertical scan circuit 13 raises a transfer signal TG1 to Hi for a predetermined period to turn on the first readout transistor 32. The on-state first readout transistor 32 allows the photodiode 31 to transfer the charge stored therein to the pixel memory 33.

When row P is in a horizontal scanning period (1H) in the $n^{th}$ frame, the selection signal SEL, reset signal RST and transfer signal TG2 are all in a Lo state, and therefore all the selection transistor 38, reset transistor 36 and second readout transistor 34 remain off.

[Readout Operation from Photodiode in $n^{th}+1$ Frame]

Figure 6:
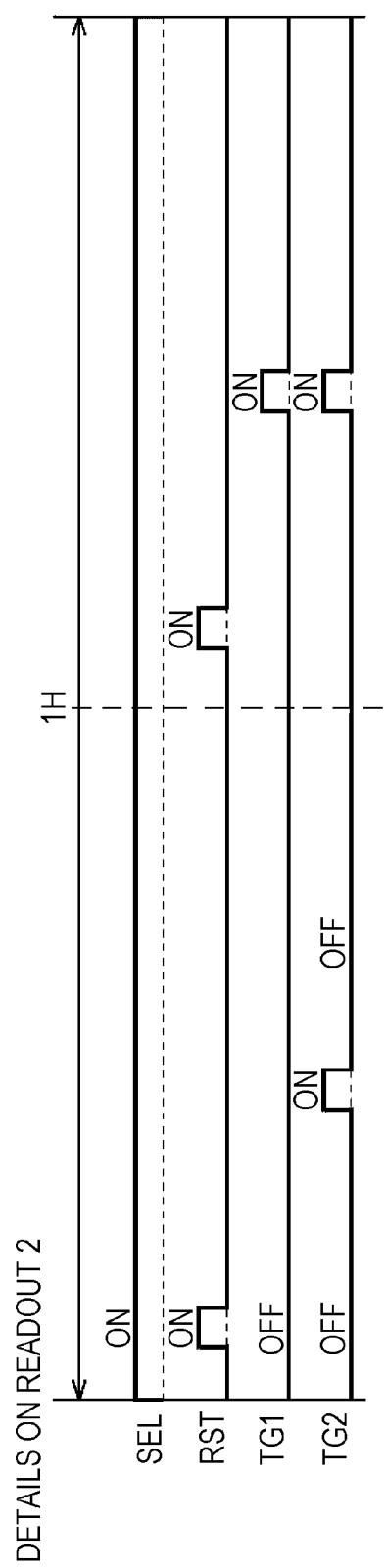
FIG. 6 is a timing diagram for describing in detail an operation to read out a charge from the photodiode in the $n^{th}$ frame.

FIG. 6 is a timing diagram for describing in detail an operation of reading out a charge in the pixel memory 33 and a operation of reading out a charge in the photodiode 31 stored after the previous charge has been transferred to the pixel memory 33 in a pixel 21 on row p in the $n^{th}+1$ frame.

In the $n^{th}+1$ frame, when row p enters the horizontal scanning period (1H), a Hi selection signal SEL is fed to the selection transistor 38 to maintain the selection transistor 38 in an on state while the row p is in the horizontal scanning period.

After the selection transistor 38 is turned on with the row p in the horizontal scanning period (1H), a reset signal RST is first raised to Hi for a predetermined period to turn on the reset transistor 36 that in turn resets the potential of the FD 35.

Then, a transfer signal TG2 is raised to Hi for a predetermined period to turn on the second readout transistor 34. The on-state second readout transistor 34 allows the pixel memory 33 to output the charge held therein to the ADC 25 via the vertical signal line 23.

Then, the reset signal RST is again raised to Hi for a predetermined period to turn on the reset transistor 36 that in turn resets the potential of the FD 35.

Subsequently the transfer signal TG1 and transfer signal TG2 are concurrently raised to Hi to concurrently turn on the first readout transistor 32 and second readout transistor 34. The on-state first readout transistor 32 and second readout transistor 34 allow a charge, which is stored in the photodiode 31 after the previous charge has been transferred to the pixel memory 33 in the $n^{th}$ frame, to be output to the ADC 25 via the vertical signal line 23.

In the frame difference output mode, the above-described operations performed across the two frames, i.e., the $n^{th}$ frame and $n^{th}+1$ frame, are repeated.

[Description on Amount of Accumulated Charge for Unchanged Subject]

Figure 7:
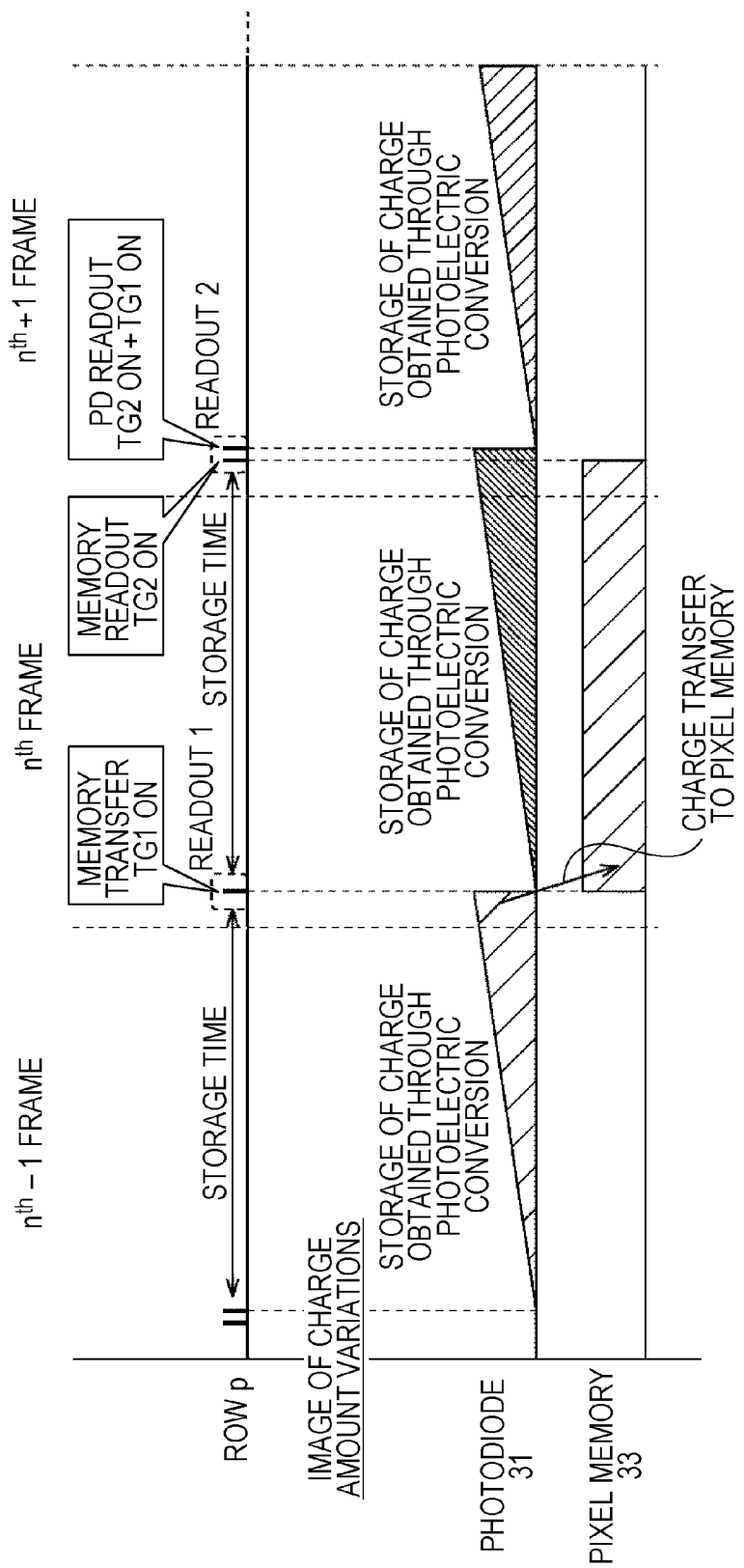
FIG. 7 conceptualizes amounts of charge accumulated when a subject remains unchanged.

FIG. 7 conceptualizes the amount of charges accumulated in a pixel memory 33 and a photodiode 31 on row p when a subject remains unchanged.

A charge that was generated by the photodiode 31 in the $n^{th}-1$ frame is transferred to the pixel memory 33 by turning on the first readout transistor 32 in the $n^{th}$ frame.

After the first readout transistor 32 has been turned on in the $n^{th}$ frame, the photodiode 31 again generates and accumulates charges corresponding to light received until the first readout transistor 32 and second readout transistor 34 are concurrently turned on to allow the charges to be output to the ADC 25 in the $n^{th}+1$ frame.

If there is no change in the subject, the amount of the charge held in the pixel memory 33 is equal to the amount of the charge read out from the photodiode 31 in the $n^{th}+1$ frame.

Figure 8:
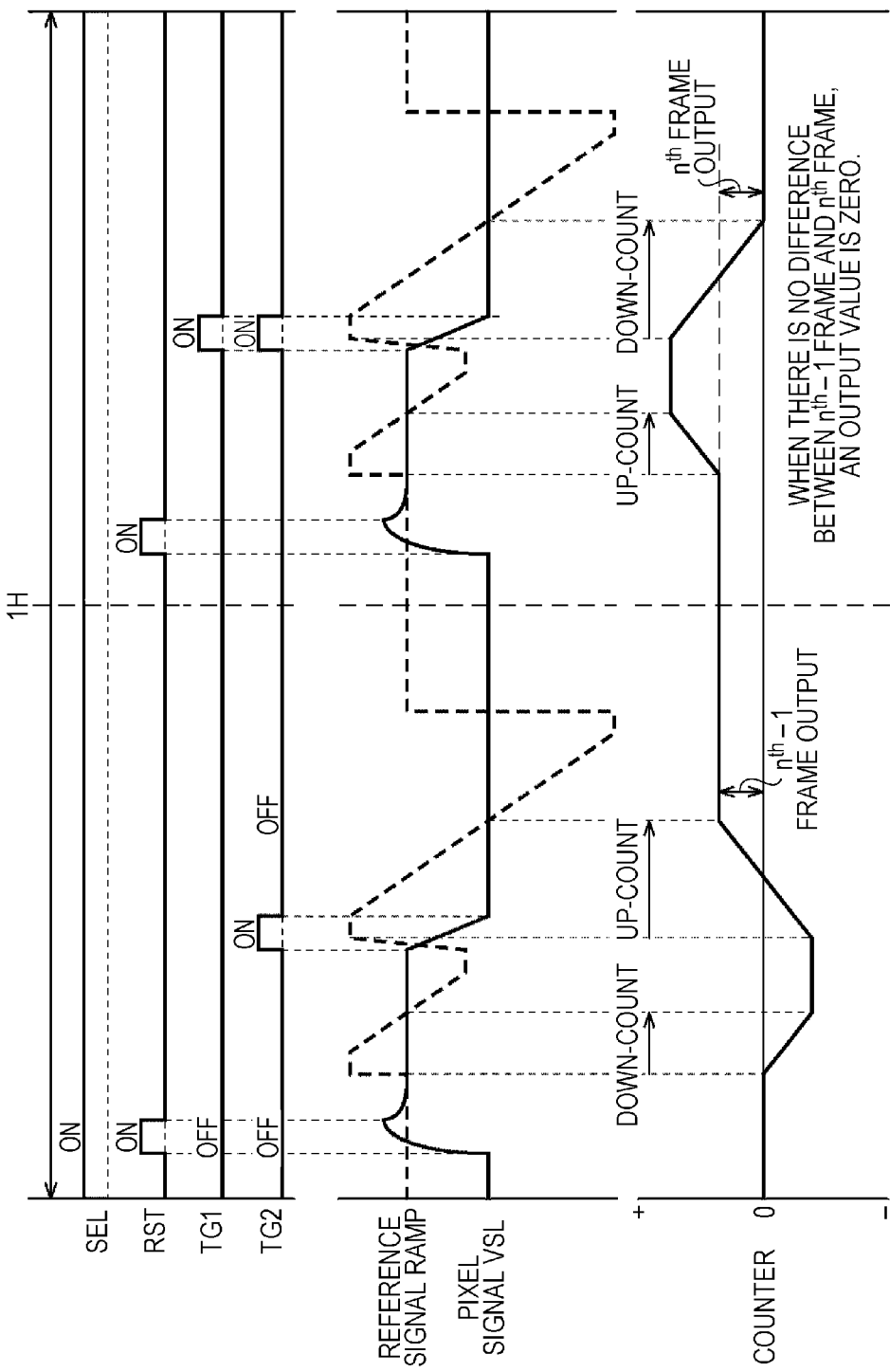
FIG. 8 illustrates operations of AD conversion processing when a subject remains unchanged.

FIG. 8 illustrates operations of AD conversion processing performed by the ADC 25 when row p is in the horizontal scanning period in the $n^{th}+1$ frame.

FIG. 8 illustrates a reference signal RAMP and a pixel signal VSL input to the comparator 43 of the ADC 25 and counting operations performed by the up/down counter 44 in accordance with the drive operations performed on row p in FIG. 6.

When row P is in a horizontal scanning period in the $n^{th}+1$ frame, the ADC 25 performs AD conversion processing, which is the same processing as performed in the moving image mode, at the time of the first pixel readout in which a charge held by the pixel memory 33 is input to the ADC 25 as a pixel signal VSL of the $n^{th}-1$ frame and at the time of the second pixel readout in which a charge read out from the photodiode 31 is input to the ADC 25 as a pixel signal VSL of the $n^{th}$ frame. The up/down counter 44 of the ADC 25 changes its up/down count direction (the order of a down-count and an up-count) between the first AD conversion processing and the second AD conversion processing.

Specifically, as shown in FIG. 8, at the time of the first pixel readout in which a charge held by the pixel memory 33 is input as a pixel signal VSL of the $n^{th}-1$ frame, the up/down counter 44 counts down only while a Hi difference signal is being supplied during a P-phase AD conversion period and counts up only while a Hi difference signal is being supplied during a D-phase AD conversion period.

Comparison between a count value obtained through the first P-phase down-count and a count value obtained through the first D-phase up-count demonstrates that the count value obtained through the D-phase up-count is larger by the number of counts corresponding to the amount of the charge held by the pixel memory 33. Consequently, the up/down counter 44 provides a positive count value (output value of the $n^{th}-1$ frame) at the end of the first D-phase AD conversion period.

At the time of the second pixel readout in which the charge read out from the photodiode 31 is input as a pixel signal VSL of the $n^{th}$ frame, the up/down counter 44 starts counting from the count value obtained at the end of the first D-phase AD conversion period and counts up only while a Hi difference signal is being supplied during a P-phase AD conversion period and counts down only while a Hi difference signal is being supplied during a D-phase AD conversion period.

Comparison between a count value obtained through the second P-phase up-count and a count value obtained through the D-phase down-count demonstrates that the count value obtained through the D-phase down-count is larger by the number of counts corresponding to the amount of the charge read out from the photodiode 31. When there is no change in the subject between the $n^{th}-1$ frame and $n^{th}$ frame, the number of counts incremented through the second D-phase down-count is equal to the number of counts incremented through the first P-phase up-count. Therefore, the number of increments obtained in the first D-phase up-count and the number of decrements obtained in the second D-phase down-count compensated for each other, and the resultant count value obtained by the up/down counter 44 at the end of the second D-phase AD conversion period is 0. Consequently, the ADC 25 can output 0 as the difference between the pixel signal VSL of the $n^{th}-1$ frame and the pixel signal VSL of the $n^{th}$ frame.

[Description on Amount of Accumulated Charge for Changing Subject]

Next, the case where there are changes in a subject, more specifically, where the subject in the $n^{th}$ frame has a brightness level lower than the subject in the $n^{th}-1$ frame, will be described.

Figure 9:
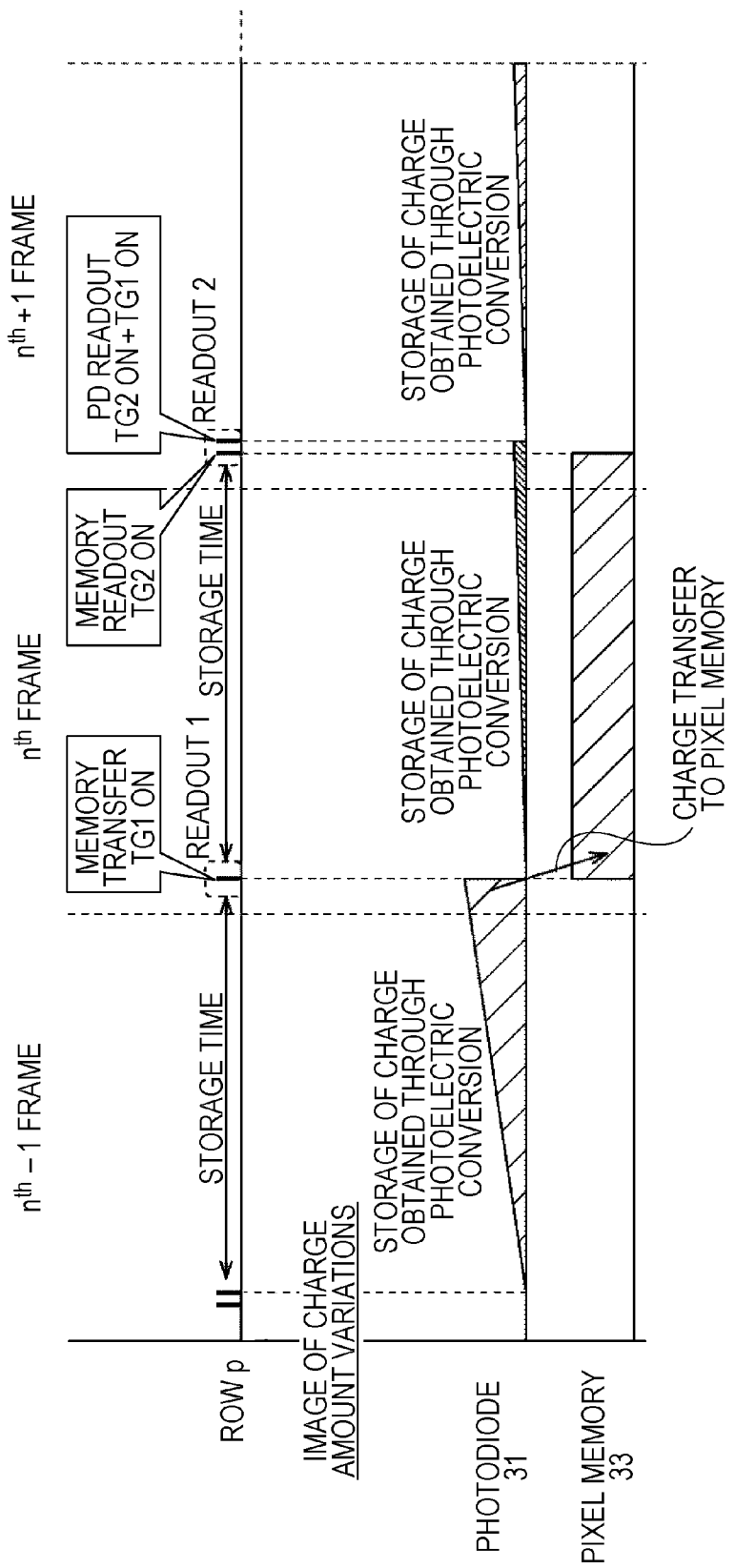
FIG. 9 conceptualizes amounts of charge accumulated when a subject changes.

Similar to FIG. 7, FIG. 9 conceptualizes the amount of charges accumulated in a pixel memory 33 and a photodiode 31 when a subject changes.

When the brightness of the subject in the $n^{th}$ frame is lower than that of the subject in the $n^{th}-1$ frame, the amount of charge read out from the photodiode 31 in the $n^{th}+1$ frame is smaller than the amount of charge held in the pixel memory 33.

Figure 10:
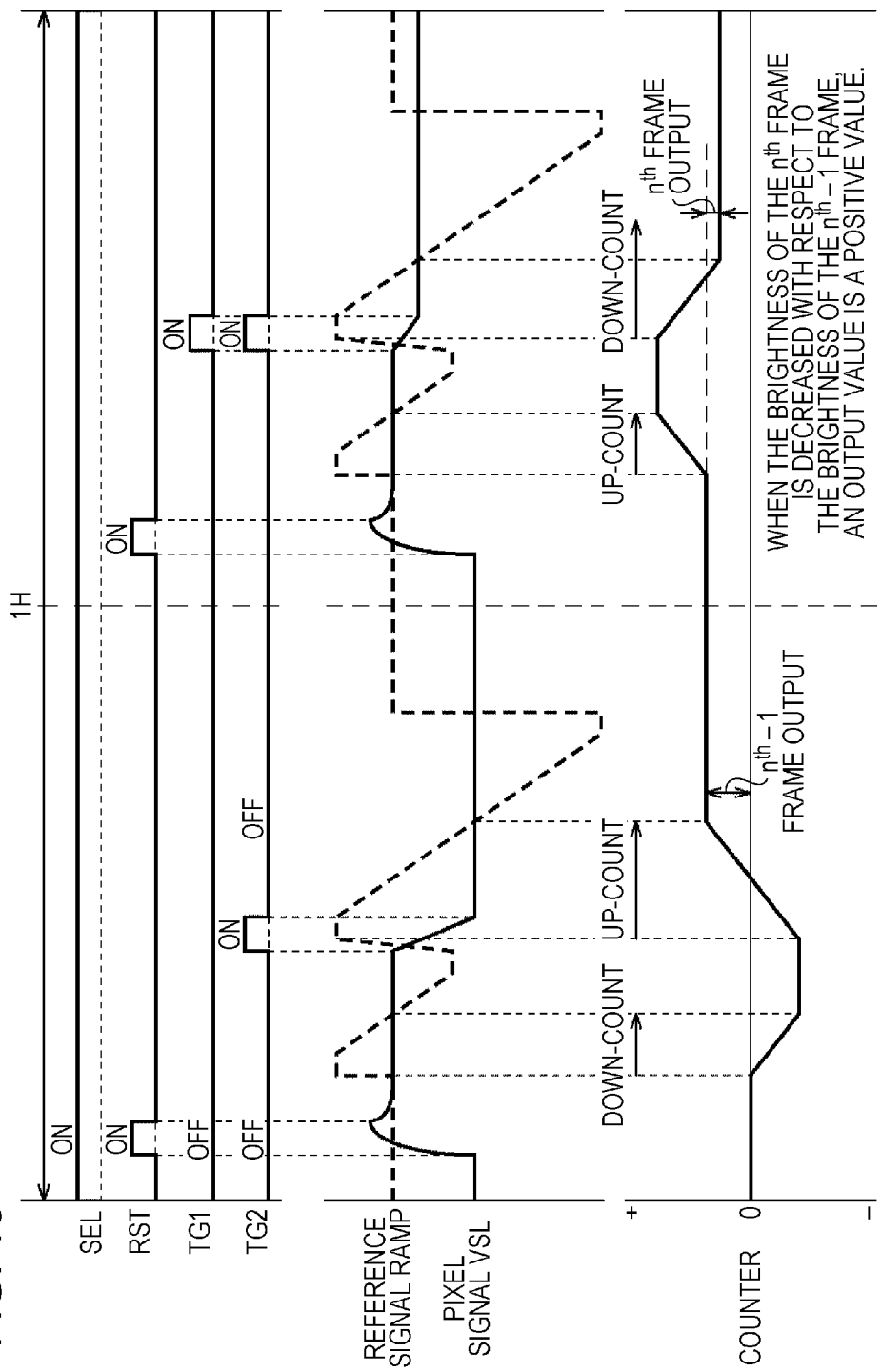
FIG. 10 illustrates operations of AD conversion processing when a subject changes.

Similar to FIG. 8, FIG. 10 illustrates operations of AD conversion processing for the changing subject performed by the ADC 25 when row p is in the horizontal scanning period in the $n^{th}+1$ frame.

The same operations as those described in FIG. 8 are performed at the time of the first pixel readout in which a charge held in the pixel memory 33 is input as a pixel signal VSL of the $n^{th}-1$ frame. Therefore, the up/down counter 44 provides a positive count value (output value of the $n^{th}-1$ frame) at the end of the D-phase AD conversion period.

However, because the subject in the $n^{th}$ frame has a brightness level lower than the subject in the $n^{th}-1$ frame, the count value that is obtained in the D-phase down-count at the time of the second pixel readout in which a charge read out from the photodiode 31 is input as a pixel signal VSL of the $n^{th}$ frame is smaller than the count value obtained in the first D-phase up-count.

In other words, because the number of increments obtained in the first D-phase up-count is greater than the number of decrements obtained in the second D-phase down-count, the resultant count value obtained by the up/down counter 44 at the end of the second D-phase AD conversion period is a positive value. Therefore, when the subject brightness of the $n^{th}$ frame is lower than that of the $n^{th}-1$ frame, the ADC 25 can output a positive value as a difference between the pixel signal VSL of the $n^{th}-1$ frame and the pixel signal VSL of the $n^{th}$ frame.

As described above, in the frame difference output mode, the CMOS image sensor 11 can output a frame difference, which is a difference between the pixel signals VSL of the two consecutive frames ($n^{th}-1$ frame and $n^{th}$ frame).

In the foregoing example, the CMOS image sensor 11 performs count operations in the order from a down-count (P-phase AD conversion period) to an up-count (D-phase AD conversion period) at the time of the first pixel readout for reading out a charge held in the pixel memory 33, while performing count operations in the order from an up-count (P-phase AD conversion period) to a down-count (D-phase AD conversion period) at the time of the second pixel readout time for reading out a charge from the photodiode 31.

However, as long as the difference of pixel values between frames can be obtained in the second pixel readout operation, the down-count and up-count can be conducted in inverse order. Specifically, the CMOS image sensor 11 can be configured to perform count operations in the order from an up-count (P-phase AD conversion period) to a down-count (D-phase AD conversion period) at the time of the first pixel readout, while performing count operations in the order from a down-count (P-phase AD conversion period) to an up-count (D-phase AD conversion period) at the time of the second pixel readout. In this case, the count value, which represents a difference, has an opposite sign to the aforementioned value.

[Output Image in Frame Difference Output Mode]

Figure 11:
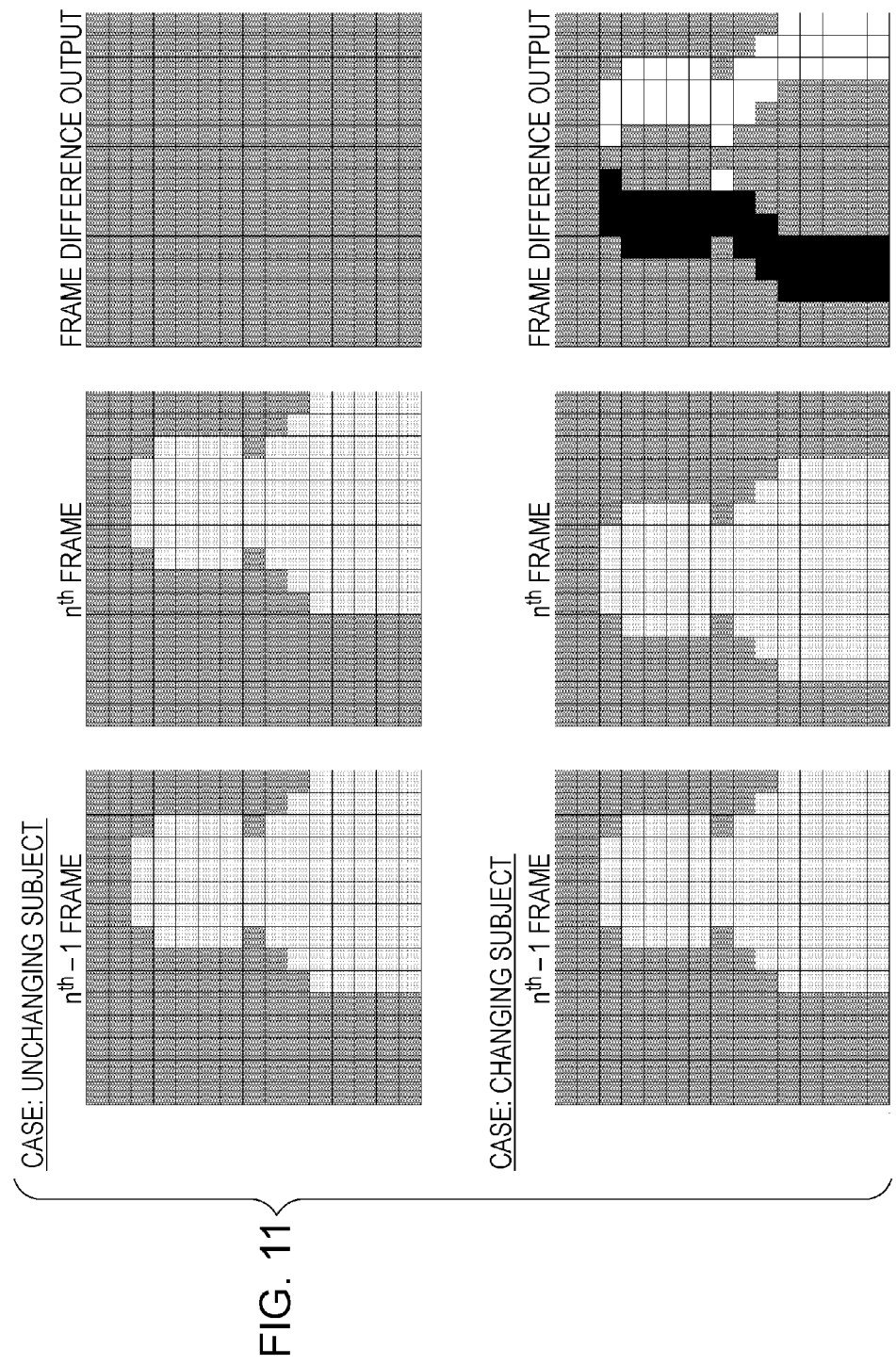
FIG. 11 illustrates output images in a frame difference output mode.

FIG. 11 shows output images by the CMOS image sensor 11 in a frame difference output mode.

The upper part of FIG. 11 shows output images when a subject remains unchanged across the $n^{th}-1$ frame and $n^{th}$ frame as shown in FIGS. 7 and 8, whereas the lower part of FIG. 11 shows output images when the subject changes across the $n^{th}-1$ frame and $n^{th}$ frame as shown in FIGS. 9 and 10.

In order to express negative values in pictures of FIG. 11 representing output images, pixels with a zero frame difference value are filled with an intermediate color (gray) between white and black, pixels with negative frame difference values are filled with a dark color (black), and pixels with positive frame difference values are filled with a bright color (white).

Figure 12:
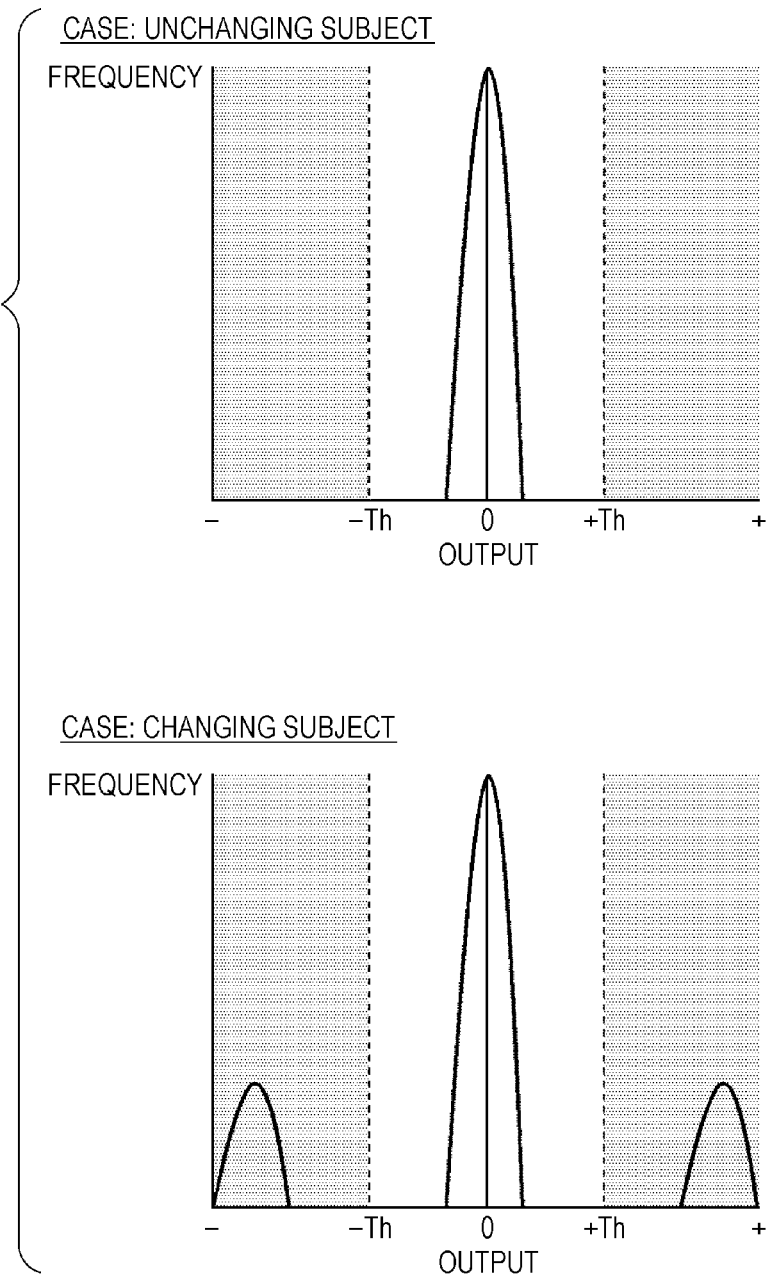
FIG. 12 illustrates processing for determining the presence or absence of changes in the subject.

FIG. 12 illustrates calculation results of frequency distributions of the frame difference output values for the case where there are no changes in the subjects between two consecutive frames and the case where there are changes.

The upper part of FIG. 12 indicates a frequency distribution of frame difference output values when there are no changes in a subject, while the lower part of FIG. 12 indicates a frequency distribution of frame difference output values when there are changes in the subject.

In the case where there are no changes in the subject, the difference output values of respective pixels congregate in the vicinity of zero as shown in FIG. 12. On the other hand, when there are changes in the subject, the difference output values of the respective pixels are gathered in the vicinity of zero, which suggests that the pixels have less frame-to-frame differences and in the vicinities of at least two predetermined values other than zero, which suggest that the pixels have great frame-to-frame differences.

The presence or absence of changes in the subject can be determined by setting a threshold Th for the difference output values to analyze the distribution of the difference output values based on the threshold Th. Specifically, it is determined that there are changes in the subject when there are difference output values in a range of −Th or lower or a range of Th or higher, i.e., the shaded ranges shown in FIG. 12, while it is determined that there are no changes in the subject when there are no difference output values in the range of −Th or lower or the range of Th or higher.

The processing for calculating the frequency distributions of the difference output values and for determining the presence of changes can be performed by providing a signal processing circuit, such as a DSP (Digital Signal Processor), on the downstream side of the output unit 20 of the CMOS image sensor 11. Alternatively, as shown by a dashed line in FIG. 1, a signal processing circuit 26 provided on the upstream side of the output unit 20 can perform the processing.

The CMOS image sensor 11 can controllably switch between drive operations performed in a moving image mode and drive operations performed in a frame difference output mode based on determination results on whether changes are present or absent in the subject. For instance, the CMOS image sensor 11 can be configured to usually output differences according to the frame difference output mode, and, once changes are recognized in the subject based on the output results of the differences, to start taking images according to the moving image mode for a certain period of time. Such usage is preferable for security cameras (surveillance cameras).

If the signal processing circuit 26 in the CMOS image sensor 11 performs the calculations to obtain the frequency distribution of difference output values and the processing to determine the presence of changes, the output unit 20 may be configured to output state signals indicative of the presence or absence of changes in the subject and signals informing switchover between the presence and absence of changes in the subject.

As described above, the CMOS image sensor 11 to which the present technology is applied can figure out differences in pixel values between the two consecutive frames and output the differences all by itself. In the past, the frame differences had to be calculated on the downstream side of an image sensor with captured images held therein; however, the use of the CMOS image sensor 11 can reduce loads of signal processing imposed on the downstream side of the CMOS image sensor 11.

[Cross Sectional Structure of Front-Illuminated CMOS Image Sensor 11]

The aforementioned CMOS image sensor 11 can be manufactured as a front-illuminated image sensor or a back-illuminated image sensor.

Figure 13A:
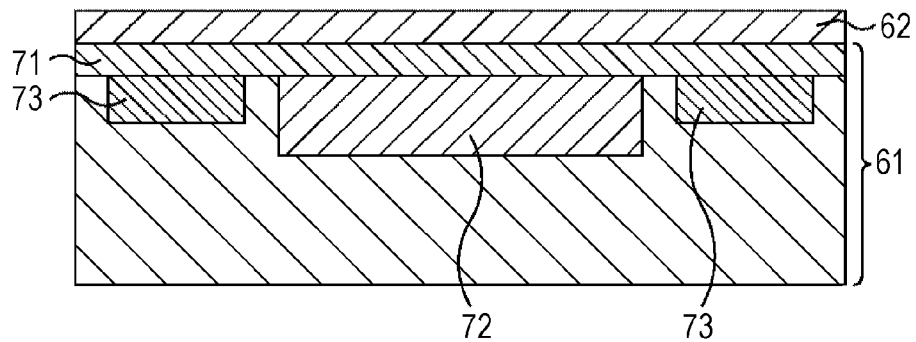
FIGS. 13A and 13B schematically depict the cross sectional structure of a silicon substrate when the CMOS image sensor is manufactured as a front-illuminated image sensor.
Figure 13B:
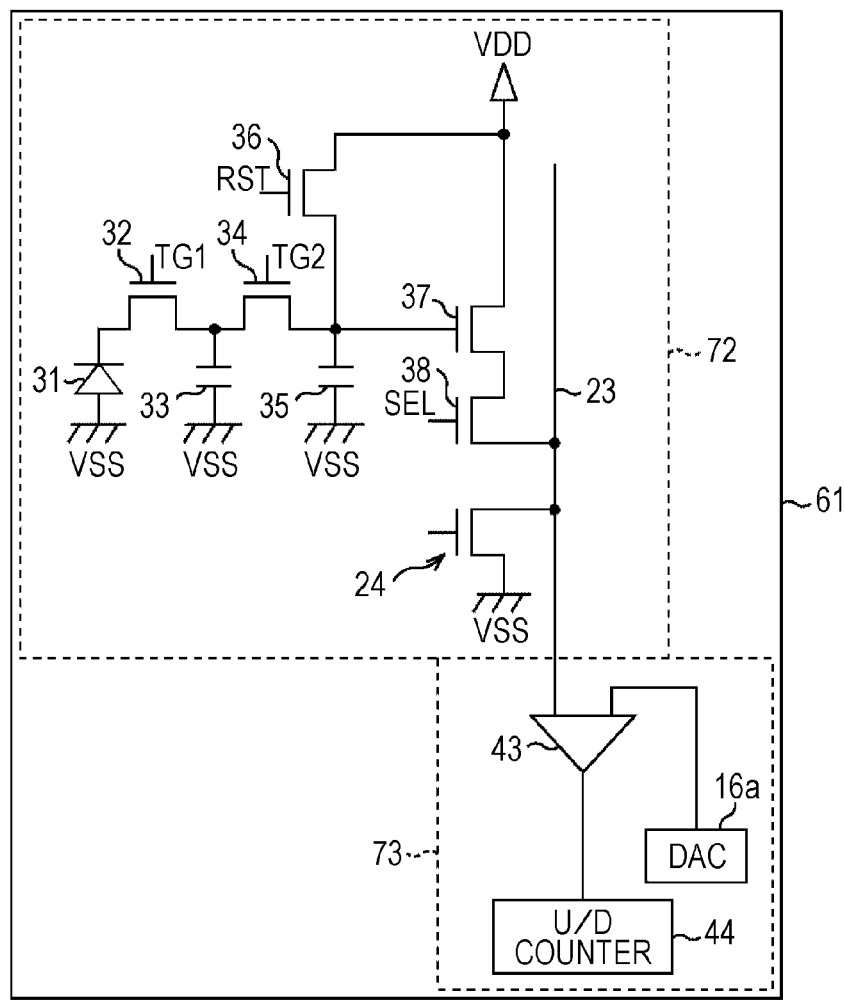

FIGS. 13A and 13B schematically depict the cross sectional structure of a silicon substrate (semiconductor substrate) when the CMOS image sensor 11 is manufactured as a front-illuminated image sensor.

The front-illuminated CMOS image sensor 11 includes, as shown in FIG. 13A, an upper layer 62, which is composed of a color filter, an on-chip lens and other components, formed on the upper side of a silicon substrate 61. In the silicon substrate 61, a metal wiring layer 71 is formed near the upper layer 62, and a pixel region 72 and logic circuits 73 are formed under the metal wiring layer 71.

As shown in FIG. 13B, a photodiode 31 and control circuitry, such as a first readout transistor 32 and a second readout transistor 34, are formed in the pixel region 72, and a comparator 43, an up/down counter 44, a DAC 16a and other components are formed in the logic circuit 73.

[Cross Sectional Structure of Back-Illuminated CMOS Image Sensor 11]

Figure 14A:
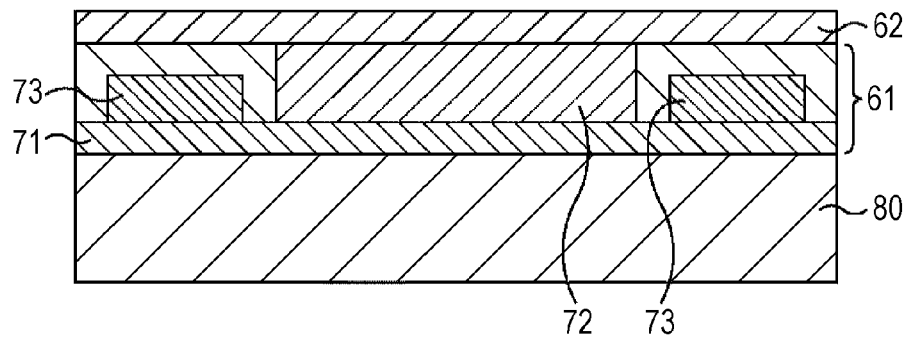
FIGS. 14A and 14B schematically depict the cross sectional structure of a silicon substrate when the CMOS image sensor is manufactured as a back-illuminated image sensor.
Figure 14B:
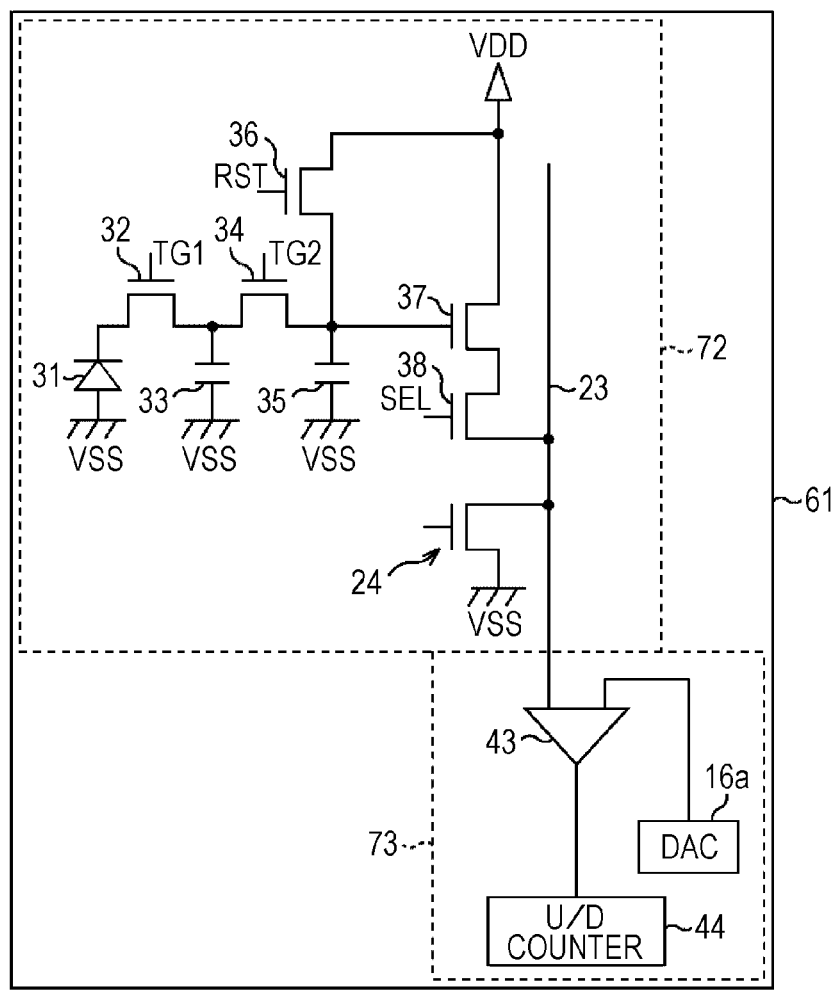

FIGS. 14A and 14B schematically depict the cross sectional structure of a silicon substrate when the CMOS image sensor 11 is manufactured as a back-illuminated image sensor.

The back-illuminated CMOS image sensor 11 includes, as shown in FIG. 14A, a silicon substrate 61 and an upper layer 62 formed over a supporting substrate 80. No circuits are formed in the supporting substrate 80.

In the back-illuminated CMOS image sensor, a metal wiring layer 71 is formed near the supporting substrate 80, and a pixel region 72 and logic circuits 73 are formed between the metal wiring layer 71 and the upper layer 62. The pixel region 72 and logic circuits 73 shown in FIG. 14B are configured in the same manner as those in the front-illuminated CMOS image sensor.

[First Cross Sectional Structure of Stacked CMOS Image Sensor 11]

In addition to the front-illuminated or back-illuminated CMOS image sensors, the CMOS image sensor 11 can be also manufactured as a stacked image sensor.

Figure 15A:
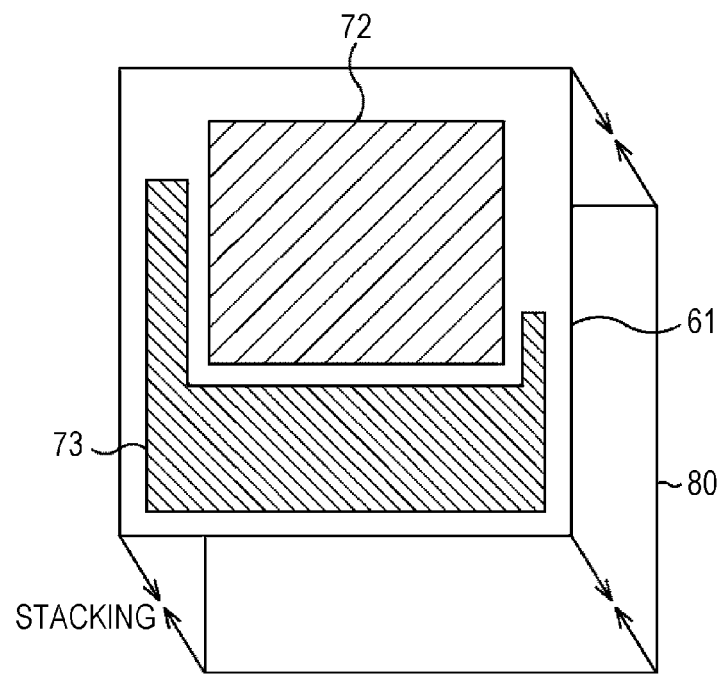
FIGS. 15A and 15B illustrate a stacked image sensor.

The aforementioned back-illuminated CMOS image sensor 11 is made by stacking the silicon substrate 61 on the supporting substrate 80 and forming the pixel region 72 and logic circuits 73 in the single silicon substrate 61 as shown in FIG. 15A.

Figure 15B:
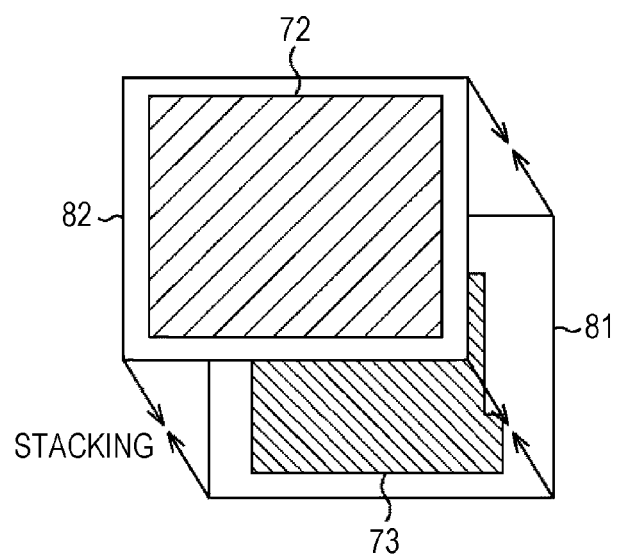

On the other hand, the stacked CMOS image sensor is made by, for example, preparing a first silicon substrate 81 with a logic circuit 73 formed therein and bonding a second silicon substrate 82 with a pixel region 72 formed therein on the first silicon substrate 81, instead of the supporting substrate 80, as shown in FIG. 15B. Details on the structure of the stacked CMOS image sensor are disclosed in, for example, Japanese Unexamined Patent Application Publication Nos. 2010-245506 and 2011-96851.

Figure 16A:
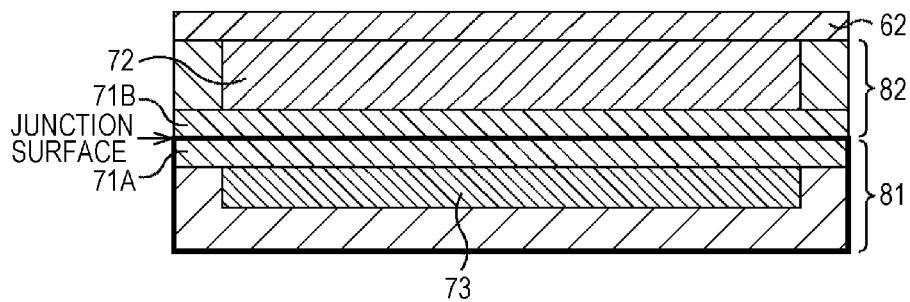
FIGS. 16A and 16B schematically depict the cross sectional structure of a silicon substrate when the image sensor is manufactured as a stacked image sensor.
Figure 16B:
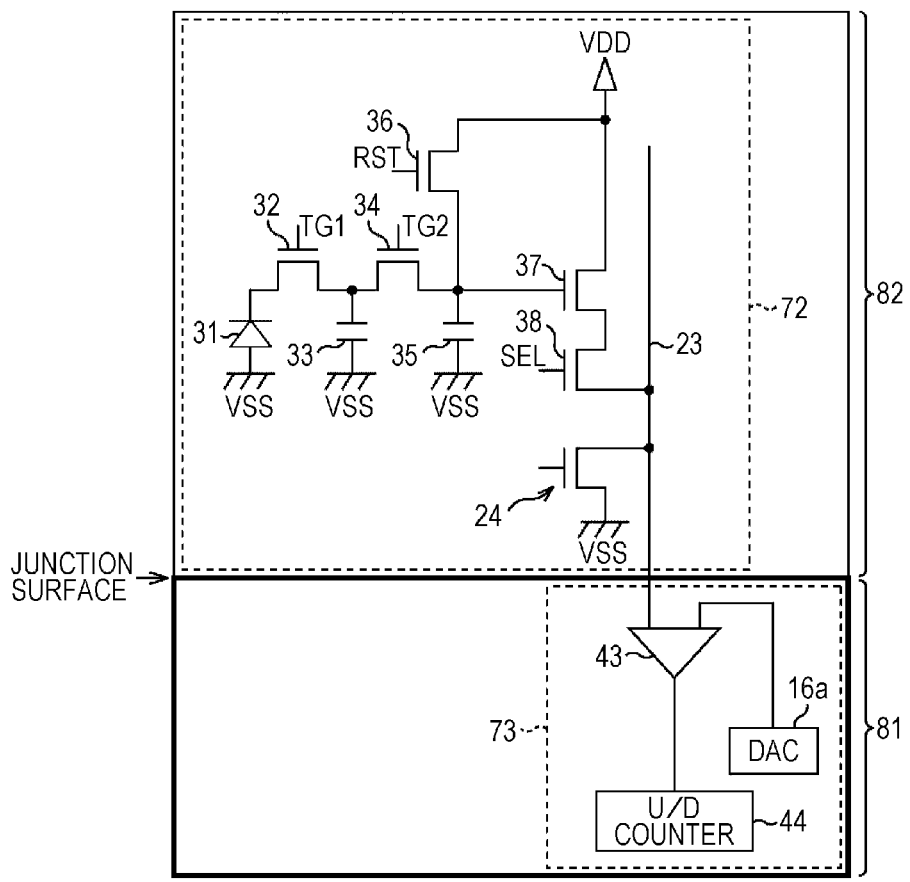

FIGS. 16A and 16B schematically depict the first cross sectional structure of a silicon substrate when the CMOS image sensor 11 is manufactured as a stacked CMOS image sensor.

In the first structure of the stacked image sensor, the aforementioned metal wiring layer 71 is separately formed as shown in FIG. 16A: a metal wiring layer 71A in the first silicon substrate 81 on the lower side; and a metal wiring layer 71B in the second silicon substrate 82 on the upper side. In the first silicon substrate 81 on the lower side, a logic circuit 73 is formed on the lower side of the metal wiring layer 71A, while in the second upper silicon substrate 82, a pixel region 72 is formed on the upper side of the metal wiring layer 71B.

The configuration of the pixel region 72 and logic circuit 73 formed in the first silicon substrate 81 and second silicon substrate 82, respectively, is identical to that in the front-illuminated and back-illuminated CMOS image sensors.

[Second Cross Sectional Structure of Stacked CMOS Image Sensor 11]

Figure 17A:
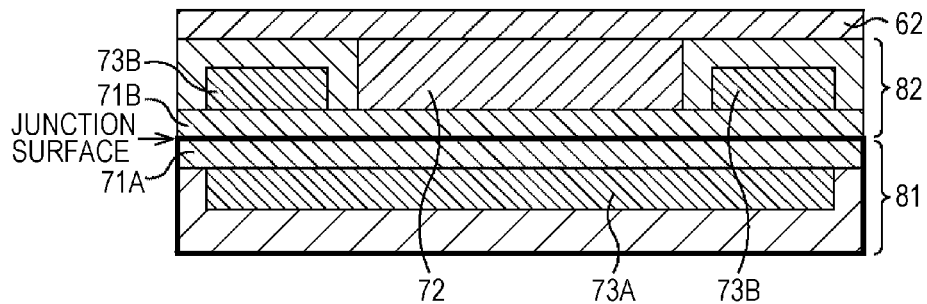
FIGS. 17A and 17B schematically depict the cross sectional structure of a silicon substrate when the image sensor is manufactured as a stacked image sensor.
Figure 17B:
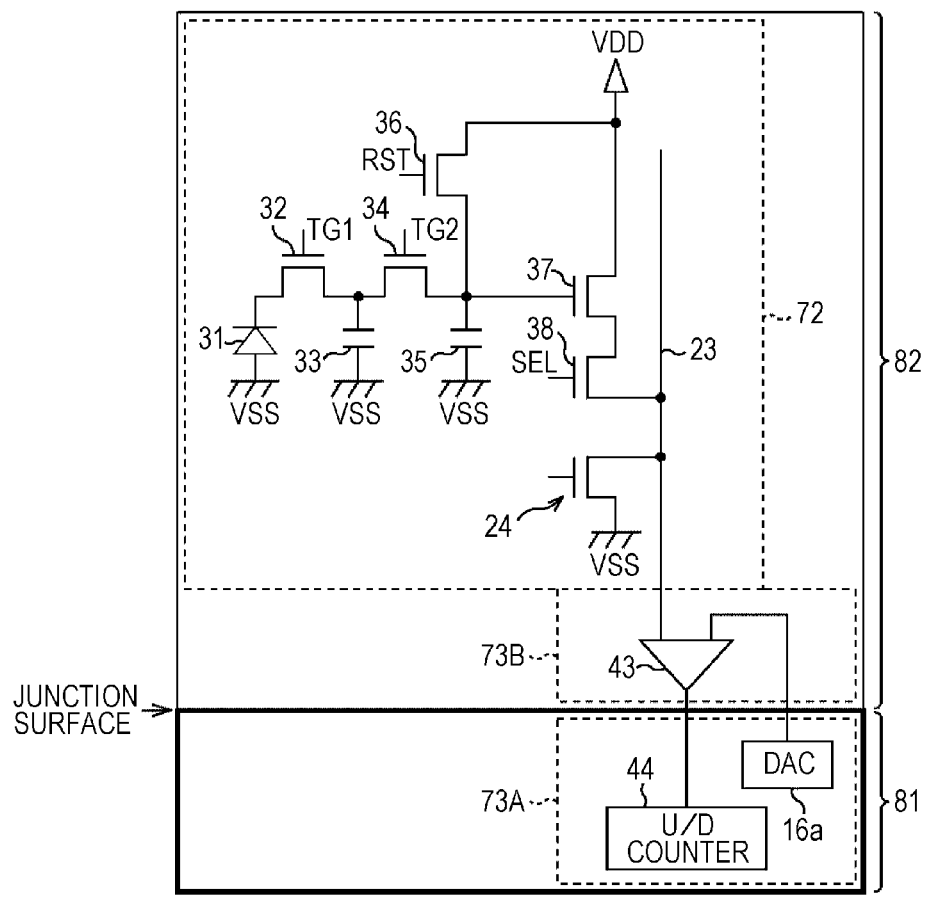

FIGS. 17A and 17B schematically depict the second cross sectional structure of a silicon substrate when the CMOS image sensor 11 is manufactured as a stacked image sensor.

The second structure is the same as the first structure shown in FIG. 16A in that the metal wiring layer 71A is formed in the first silicon substrate 81 on the lower side, the metal wiring layer 71B is formed in the second silicon substrate 82 on the upper side, and the pixel region 72 is formed in the second silicon substrate 82 on the upper side.

However, the second structure is different from the first structure in that the logic circuit 73, which is formed only in the first silicon substrate 81 in the first structure, is separately formed as a logic circuit 73A in the first silicon substrate 81 on the lower side and a logic circuit 73B in the second silicon substrate 82 on the upper side.

The logic circuits 73A and 73B are separately formed so as to be able to have different types of circuits. For example, as shown in FIG. 17B, digital-type circuitry, such as the up/down counter 44, is formed in the logic circuit 73A in the first silicon substrate 81, while analog-type circuitry, such as the comparator 43, is formed in the logic circuit 73B in the second silicon substrate 82.

[Application Example to Electronic Apparatuses]

The aforementioned CMOS image sensor 11 can be applied to various electronic apparatuses, for example, imaging apparatuses, such as digital still cameras and digital video cameras, mobile phones equipped with imaging functions, and other types of apparatuses equipped with imaging functions.

Figure 18:
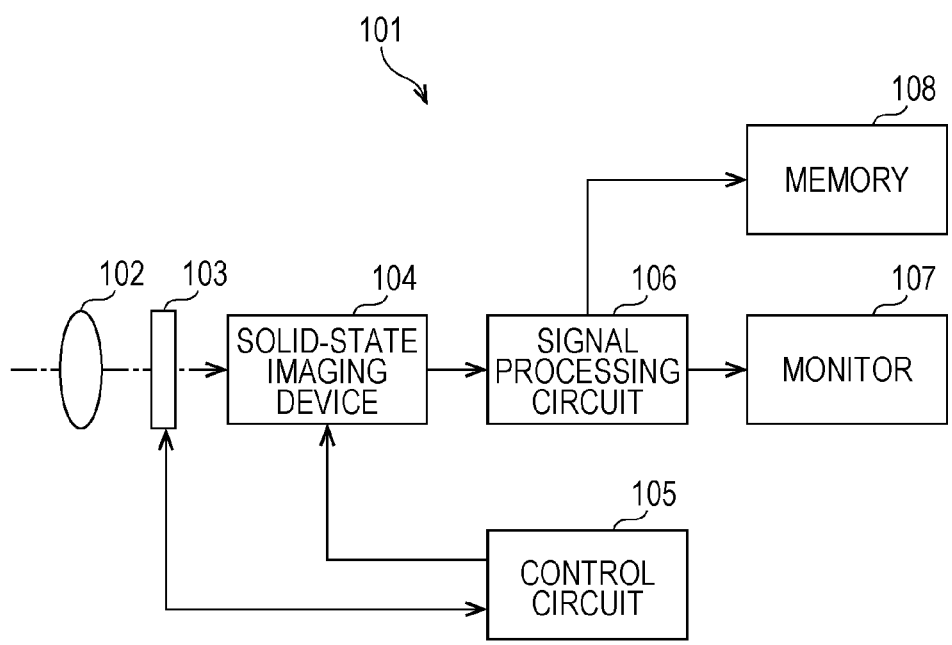
FIG. 18 is a block diagram showing a configuration example of an electronic apparatus according to an embodiment, the present technology being applied to the electronic apparatus.

FIG. 18 is a block diagram showing a configuration example of an imaging apparatus, which is an electronic apparatus to which the present technology is applied.

An imaging apparatus 101 shown in FIG. 18 includes an optical system 102, a shutter device 103, a solid-state imaging device 104, a control circuit 105, a signal processing circuit 106, a monitor 107 and a memory 108, and is capable of capturing still images and moving images.

The optical system 102 includes one or more lenses and is used to guide light from a subject (incident light) to the solid-state imaging device 104 and focus the light on a light receiving surface of the solid-state imaging device 104.

The shutter device 103 that is placed between the optical system 102 and solid-state imaging device 104 controls an exposure period in which light enters the solid-state imaging device 104 and a light blocking period in which light is blocked from entering the solid-state imaging device 104 under control of the control circuit 105.

The solid-state imaging device 104 is the aforementioned CMOS image sensor 11. The solid-state imaging device 104 stores, for a certain period, a signal charge corresponding to light, which is imaged on the light receiving surface of the solid-state imaging device 104 through the optical system 102 and shutter device 103. The signal charge accumulated in the solid-state imaging device 104 is transferred in response to a drive signal (timing signal) supplied from the control circuit 105. The solid-state imaging device 104 can be implemented as a single chip, or can be packaged with components, including from the optical system 102 to the signal processing circuit 106, as a part of a camera module.

The control circuit 105 outputs drive signals used to control the transfer operations of the solid-state imaging device 104 and the shutter operations of the shutter device 103 to actuate the solid-state imaging device 104 and shutter device 103.

The signal processing circuit 106 performs various signal processing operations on pixel signals output from the solid-state imaging device 104. The image (image data) obtained through the signal processing operations performed by the signal processing circuit 106 is sent to the monitor 107 to display it thereon or sent to the memory 108 to store (record) it therein.

It should be understood that embodiments of the present technology are not limited to the foregoing embodiments, and various changes and modifications may be made without departing from the spirit of the present technology.

For instance, an embodiment made by combining part of or all of the foregoing embodiments can be adopted.

The present technology can be configured as follows.

[1] A solid-state imaging device including:

a pixel array unit with a plurality of pixels arranged therein, each of the pixels including at least a photoelectric conversion element that generates a charge corresponding to light received and a memory that holds the charge generated by the photoelectric conversion element; and an AD conversion unit that performs AD conversion to convert a pixel signal that corresponds to the charge output from the pixel into a count value, wherein the pixel transfers the charge generated by the photoelectric conversion element to the memory so as to hold the charge in the memory in the $n^{th}$ frame, and sequentially outputs, in the $n^{th}+1$ frame, a first pixel signal corresponding to the charge held in the memory and a second pixel signal corresponding to a charge generated by the photoelectric conversion element after the previous charge has been transferred to the memory, and the AD conversion unit, in the $n^{th}+1$ frame, changes its up/down count direction between the first pixel signal and the second pixel signal to obtain their count values so as to successively perform AD conversion on the first pixel signal and the second pixel signal.

[2] The solid-state imaging device cited in [1], wherein the AD conversion unit includes a comparator that outputs a difference signal obtained by comparing a reference signal of a ramp waveform with the pixel signal output from the pixel, and a counter that performs a count operation over a period in which the difference signal is at a predetermined level, and the counter starts counting the difference signal associated with the second pixel signal starting from a count value of the difference signal associated with the first pixel signal.

[3] The solid-state imaging device cited in [1] or [2], further including a signal processing circuit that determines the presence or absence of changes in a subject on the basis of the count value of the difference between the first pixel signal and the second pixel signal.

[4] A method for controlling a solid-state imaging device that includes a pixel array unit with a plurality of pixels arranged therein, each of the pixels including at least a photoelectric conversion element that generates a charge corresponding to light received and a memory that holds the charge generated by the photoelectric conversion element, and an AD conversion unit that performs AD conversion to convert a pixel signal that corresponds to the charge output from the pixel into a count value, the method including:

causing the pixel to transfer the charge generated by the photoelectric conversion element to the memory so as to hold the charge in the memory in the $n^{th}$ frame, and to sequentially output, in the $n^{th}+1$ frame, a first pixel signal corresponding to the charge held in the memory and a second pixel signal corresponding to a charge generated by the photoelectric conversion element after the previous charge has been transferred to the memory, and causing the AD conversion unit, in the $n^{th}+1$ frame, to change its up/down count direction between the first pixel signal and the second pixel signal to obtain their count values so as to successively perform AD conversion on the first pixel signal and the second pixel signal.

[5] An electronic apparatus including a solid-state imaging device having:

a pixel array unit with a plurality of pixels arranged therein, each of the pixels including at least a photoelectric conversion element that generates a charge corresponding to light received and a memory that holds the charge generated by the photoelectric conversion element; and an AD conversion unit that performs AD conversion to convert a pixel signal that corresponds to the charge output from the pixel into a count value, wherein the pixel transfers the charge generated by the photoelectric conversion element to the memory so as to hold the charge in the memory in the $n^{th}$ frame, and sequentially outputs, in the $n^{th}+1$ frame, a first pixel signal corresponding to the charge held in the memory and a second pixel signal corresponding to a charge generated by the photoelectric conversion element after the previous charge has been transferred to the memory, and the AD conversion unit, in the $n^{th}+1$ frame, changes its up/down count direction between the first pixel signal and the second pixel signal to obtain their count values so as to successively perform AD conversion on the first pixel signal and the second pixel signal.

The present disclosure contains subject matter related to that disclosed in Japanese Priority Patent Application JP 2012-204107 filed in the Japan Patent Office on Sep. 18, 2012, the entire contents of which are hereby incorporated by reference.

What is claimed is:

1. A solid-state imaging device comprising:
    a pixel array unit with a plurality of pixels arranged therein, each of the plurality of pixels including at least a photoelectric conversion element that generates a charge corresponding to light received and a memory that holds the charge generated by the photoelectric conversion element; and
    an AD conversion unit that performs AD conversion processing to convert a pixel signal that corresponds to the charge output from a pixel into a count value, wherein
    the pixel transfers the charge generated by the photoelectric conversion element to the memory so as to hold the charge in the memory in a $n^{th}$ frame, and sequentially outputs, in a $(n+1)^{th}$ frame, a first pixel signal corresponding to the charge held in the memory and a second pixel signal corresponding to a charge generated by the photoelectric conversion element after the previous charge has been transferred to the memory, and
    the AD conversion unit, in the $(n+1)^{th}$ frame, changes its up/down count direction between the first pixel signal and the second pixel signal to obtain their count values so as to successively perform AD conversion on the first pixel signal and the second pixel signal, wherein the AD conversion on the first pixel signal of the $n^{th}$ frame and the successive AD conversion on the second pixel signal of the $(n+1)^{th}$ frame have a period for measurement of a reset component before a period for measurement of a combination of a signal component and the reset component.

2. The solid-state imaging device according to claim 1, wherein the AD conversion unit includes
    a comparator that outputs a difference signal obtained by comparing a reference signal of a ramp waveform with the pixel signal output from the pixel, and
    a counter that performs a count operation over a period in which the difference signal is at a predetermined level, wherein
    the counter starts counting the difference signal associated with the second pixel signal starting from a count value of the difference signal associated with the first pixel signal.

3. The solid-state imaging device according to claim 1, further comprising a signal processing circuit that determines the presence or absence of changes in a subject on the basis of the count value of the difference between the first pixel signal and the second pixel signal.

4. The solid-state imaging device according to claim 1, further comprising a circuit configured to calculate frequency distributions of frame difference output values between the $n^{th}$ frame and the $(n+1)^{th}$ frame, wherein the frequency distributions are calculated based on the count value.

5. A method for controlling a solid-state imaging device, the method comprising:
    causing a pixel, of a pixel array unit with a plurality of pixels arranged therein, to transfer a charge generated by a photoelectric conversion element of the pixel to a memory so as to hold the charge in the memory in a nth frame, and to sequentially output, in a $(n+1)^{th}$ frame, a first pixel signal corresponding to the charge held in the memory and a second pixel signal corresponding to a charge generated by the photoelectric conversion element after the previous charge has been transferred to the memory; and
    causing an AD conversion unit, in the $(n+1)^{th}$ frame, to change its up/down count direction between the first pixel signal and the second pixel signal to obtain their count values so as to successively perform AD conversion on the first pixel signal and the second pixel signal,
    wherein the AD conversion on the first pixel signal of the $n^{th}$ frame and the successive AD conversion on the second pixel signal of the $(n+1)^{th}$ frame have a period for measurement of a reset component before a period for measurement of a combination of a signal component and the reset component.

6. An electronic apparatus comprising a solid-state imaging device including:
    a pixel array unit with a plurality of pixels arranged therein, each of the plurality of pixels including at least a photoelectric conversion element that generates a charge corresponding to light received and a memory that holds the charge generated by the photoelectric conversion element; and
    an AD conversion unit that performs AD conversion processing to convert a pixel signal that corresponds to the charge output from a pixel into a count value, wherein
    the pixel transfers the charge generated by the photoelectric conversion element to the memory so as to hold the charge in the memory in a $n^{th}$ frame, and sequentially outputs, in a $(n+1)^{th}$ frame, a first pixel signal corresponding to the charge held in the memory and a second pixel signal corresponding to a charge generated by the photoelectric conversion element after the previous charge has been transferred to the memory, and
    the AD conversion unit, in the $(n+1)^{th}$ frame, changes its up/down count direction between the first pixel signal and the second pixel signal to obtain their count values so as to successively perform AD conversion on the first pixel signal and the second pixel signal, wherein the AD conversion on the first pixel signal of the $n^{th}$ frame and the successive AD conversion on the second pixel signal of the $(n+1)^{th}$ frame have a period for measurement of a reset component before a period for measurement of a combination of a signal component and the reset component.

* * * * *